United States Patent
Kim et al.

(10) Patent No.: US 6,483,758 B1
(45) Date of Patent: Nov. 19, 2002

(54) INTEGRATED CIRCUIT TEST SYSTEMS THAT USE DIRECT CURRENT SIGNALS AND IMPEDANCE ELEMENTS TO IMPROVE TEST SIGNAL TRANSMISSION SPEED AND REDUCE TEST SIGNAL DISTORTION

(75) Inventors: Jae-Hee Kim, Kyungki-do (KR); Young-Man Ahn, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/387,475

(22) Filed: Sep. 1, 1999

(30) Foreign Application Priority Data

Sep. 8, 1998 (KR) .............................. 98-36934

(51) Int. Cl.$^7$ ................................................ G11C 7/00
(52) U.S. Cl. ...................... 365/201; 365/63; 365/189.09
(58) Field of Search .................. 365/201, 63, 189.05, 365/189.07, 189.09

(56) References Cited

U.S. PATENT DOCUMENTS 5,285,419 A * 2/1994 Iyengar ...................... 365/201
5,917,765 A * 6/1999 Morishita et al. ........... 365/201
5,930,185 A * 7/1999 Wendell ...................... 365/201
6,185,139 B1 * 2/2001 Pantelakis et al. .......... 365/201
6,292,415 B1 * 9/2001 Brehm ........................ 365/201

* cited by examiner

Primary Examiner—Son T. Dinh
(74) Attorney, Agent, or Firm—Myers Bigel Sibley & Sajovec

(57) ABSTRACT

Integrated circuit test systems include an input driver having an output terminal that is connected to a test system port and a biasing device that is connected between the test system port and a reference voltage. The biasing device comprises a Thévenin equivalent circuit that is represented by an impedance element and a nonzero power source. The impedance element may be used to match the impedance of a device under test, which can reduce distortion in signals passed between the device under test and the test system. Furthermore, the power source may be used to provide direct current (DC) signals at the pins of a device under test, which can allow the swing height (e.g., amplitude or magnitude) of the test signals to be reduced. That is, the test signals are superimposed upon the DC voltages to allow "high" and "low" logic levels to be manifested via relatively minor swings in the test signals. By reducing the swing height of the test signals, transmission speed can be improved thereby reducing round trip signal delay.

29 Claims, 4 Drawing Sheets

INTEGRATED CIRCUIT TEST SYSTEMS THAT USE DIRECT CURRENT SIGNALS AND IMPEDANCE ELEMENTS TO IMPROVE TEST SIGNAL TRANSMISSION SPEED AND REDUCE TEST SIGNAL DISTORTION

CROSS REFERENCE TO RELATED APPLICATION

This application claims the benefit of Korean Patent Application No. 98-36934, filed Sep. 8, 1998, the disclosure of which is hereby incorporated herein by reference.

FIELD OF THE INVENTION

The present invention relates generally to the field of integrated circuit testing, and, more particularly, to systems for testing integrated circuit memory modules and devices.

BACKGROUND OF THE INVENTION

Improvements in both speed and functionality of central processing units (CPUs) have generally resulted in accompanying improvements in memory devices to support the operation of these improved CPUs. These memory devices may comprise a plurality of integrated circuit memory elements. That is, a single memory module may include a plurality of conventional or "normal" memory elements. Unfortunately, the fabrication process may damage one or more of the conventional memory elements that comprise the memory module. Therefore, it may be desirable to test the various memory elements within a memory module to identify any elements that are inoperable.

FIG. 1 is a high-level block diagram that depicts a conventional testing system for verifying the operation of a memory module. A test unit 100 includes both the hardware and software for controlling the testing operation. The test unit 100 interfaces with a load board 120 that is used for transmitting signals output from the test unit 100. A socket printed circuit board 140 and socket 160 are used to interface the load board 120 to a memory module 180.

Broadly stated, the test unit 100 is used to test the memory module 180 as follows: The test unit 100 provides a read instruction and/or a write instruction to one or more memory elements within the memory module 180 through the load board 120, printed circuit board 140, and socket 160. The test unit 100 can then determine whether a particular memory element within the memory module 180 is operating properly by comparing data written into a memory cell with data read from the memory cell to determine if they are identical.

FIG. 2 is a schematic of a conventional test configuration using independent channel signaling that illustrates the test unit 100, load board 120, and memory module 180 in more detail. The test unit 100 includes a plurality of data input drivers 12-1, 12-3, . . . , and 12-(2n-1) that receive control signals and address data through the input terminals 10-1, 10-5, . . . , and 10-(4n-3). The test unit 100 further includes a plurality of data input drivers 12-2, 12-4, . . . , and 12-2n that receive write data through the input terminals 10-2, 10-6, . . . , and 10-(4n-2). Finally, the test unit 100 includes a plurality of comparators 14-1, 14-2, . . . , and 14-n that are used to compare read data from the memory module 180 with expected data provided through the input terminals 10-4, 10-8, . . . , and 10-4n and to generate a comparison result at the output terminals 10-3, 10-7, and 10-(4n-1).

The load board 120 includes a plurality of transmission lines 20-1, 20-3, . . . , and 20-(2n-1) that are connected to the output terminals of the data input drivers 12-1, 12-3, . . . , and 12-(2n-1). In addition, the load board 120 includes a plurality of transmission lines 20-2, 20-4, . . . , and 20-2n that are connected to the output terminals of the data input drivers 12-2, 12-4, . . . , and 12-2n and one of the input terminals of the comparators 14-1, 14-2, . . . , and 14-n as illustrated.

The memory module 180 includes a plurality of memory devices or elements 32-1, 32-2, . . . , and 32-n that include input pins 30-1, 30-3, . . . , and 30-(2n-1) and input/output pins 30-2, 30-4, . . . , and 30-2n. The input pins 30-1, 30-3, . . . , and 30-(2n-1) are connected to the transmission lines 20-1, 20-3, . . . , and 20-(2n-1) and the input/output pins 30-2, 30-4, . . . , and 30-2n are connected to the transmission lines 202, 20-4, . . . , and 20-2n. For purposes of illustration, the memory devices 32-1, 32-2, . . . , and 32-n are each depicted with a single input pin and a single input/output pin. It is nevertheless understood to those skilled in the art that the memory devices 32-1, 32-2, . . . , and 32-n typically include both a plurality of input pins and input/output pins.

A method that may be used for testing the memory module 180 is described hereafter. A typical test cycle involves the following steps: 1) input the write instruction and the write address, 2) perform a data write operation, 3) input the read instruction and read address, and 4) perform a data read operation. This cycle may be repeatedly performed until the operability of all memory devices 32-1, 32-2, . . . , and 32-n in the memory module 180 is verified. This test cycle will be discussed hereafter with reference to the independent channel test configuration of FIG. 2.

The test unit 100 receives the write instruction and write address through the input terminals 10-1, 10-5, . . . , and 10-(4n-3). The write instruction and write address are then provided to the input pins 30-1, 30-3, . . . , and 30-(2n-1) of the memory devices 32-1, 32-2, . . . , and 32-n through the data input drivers 12-1, 12-3, . . . , and 12(2n-1) and the transmission lines 20-1, 20-3, . . . , and 20-(2n-1). Next, the memory devices 32-1, 32-2, . . . , and 32-n prepare for the write operation.

The data to be written into the selected memory cell is received through the input terminals 10-2, 10-6, . . . , and 10-(4n-2) and is provided to the input/output pins 30-2, 30-4, . . . , and 30-2n of the memory devices 32-1, 32-2, . . . , and 32-n through the data input drivers 12-2, 12-4, . . . , and 12-2n and the transmission lines 20-2, 20-4, . . . , and 20-2n. The memory devices 32-1, 32-2, . . . , and 32-n then enable the data to be written into the selected memory cell.

After completing the data write operation, the test unit 100 receives the read instruction and read address through the input terminals 10-1, 10-5, . . . , and 10-(4n-3) and, simultaneously, the data that has been previously written into the memory cell corresponding to the read address is received at the input terminals 10-4, 10-8, . . . , and 10-4n. The read instruction and read address are provided to the input pins 30-1, 30-3, . . . , and 30-(2n-1) of the memory devices 32-1, 32-2, . . . , and 32-n through the data input drivers 12-1, 12-3, . . . , and 12-(2n-1) and the transmission lines 20-1, 20-3, . . . , and 20-(2n-1). Next, the memory devices 32-1, 32-2, . . . , and 32-n prepare for the read operation.

The data are then read through the input/output pins 30-2, 30-4, . . . , and 30-2n and transmission lines 20-2, 20-4, . . . , and 20-2n traversing the same path that was used to write data to the memory devices 32-1, 32-2, . . . , and 32-n. The data that are read from the memory devices 32-1, 32-2, . . . , and 32-n are compared by the comparators 14-1, 14-2, . . . , and 14-n with the expected data provided at the input terminals 10-4, 10-8, . . . , and 10-4n. The results of the comparison are provided through the output terminals 10-3, 10-7, and 10-(4n-1).

The test unit 100 uses the results of the comparison operation to determine whether the memory devices 32-1, 32-2, . . . , and 32-n are operating properly. More specifically, if a comparison result indicates that the read data and the expected data are identical, then the test unit 100 concludes that a particular memory device 32-1, 32-2, . . . , and 32-n is operating properly. On the other hand, if a comparison result indicates that the read data and expected data are not identical, then the test unit 100 identifies the particular memory device 32-1, 32-2, . . . , and 32-n as being inoperable or damaged.

Because each memory device 32-1, 32-2, . . . , and 32-n is accessed through independent signaling channels (i.e., transmission lines 20-1, 20-3, . . . , and 20-(2n-1) and transmission lines 20-2, 20-4, . . . , and 20-2n), all of the memory devices 32-1, 32-2, . . . , and 32-n contained in the memory module 180 can be tested simultaneously. Note that if the memory devices 32-1, 32-2, . . . , and 32-n that comprise the memory module 180 operate at a relatively low speed, then the testing method described in the foregoing may not be affected by the round trip delay of signals between the test unit 100 and the memory module 180. If, however, the memory devices 32-1, 32-2, . . . , and 32-n that comprise the memory module 180 operate at a relatively high speed, then the memory devices 32-1, 32-2, . . . , and 32-n may transition rapidly from a read mode to a write mode, which can cause the read and the write operations to interfere with each other unless the testing procedure accounts for the round trip delay of signals between the test unit 100 and the memory module 180.

Furthermore, if the memory devices 32-1, 32-2, . . . , and 32-n that comprise the memory module 180 operate at a relatively low speed, then the signals transferred between the memory module 180 and the test unit 100 and/or load board 120 are typically unaffected by impedance mismatches between the components. If, however, the memory devices 32-1, 32-2, . . . , and 32-n that comprise the memory module 180 operate at a relatively high speed, then impedance mismatches between the memory module 180 and the test unit 100 and/or load board 120 may cause signal distortion. Typically, the impedances of the test unit 100 and the load board 120 are predetermined or adjusted to match so as to reduce distortion in signals transferred therebetween. Nevertheless, the impedances of the test unit 100 and/or the load board 120 may be different than the impedances of the memory module 180 and/or the transmission lines (i.e., transmission lines 20-1, 20-3, . . . , and 20-(2n-1) and transmission lines 20-2, 20-4, . . . , and 20-2n), which can result in signal distortion, especially when the memory devices 32-1, 32-2, . . . , and 32-n operate at a relatively high speed.

Thus, in summary, the conventional test configuration of FIG. 2 may be useful for testing memory devices that operate at a relatively low speed. When testing memory devices that operate at a relatively high speed, however, the test configuration may be adversely affected by round trip signal delays and signal distortion due to impedance mismatches as discussed hereinabove.

FIG. 3 is a schematic of a conventional test configuration that uses common channel signaling. The test unit 100 includes a data input driver 12-1 that receives control signals and address data through an input terminal 10-1. The test unit 100 further includes a data input driver 12-2 that receives write data through an input terminal 10-2. Finally, the test unit 100 includes a comparator 14 that is used to compare read data from the memory module 180 with expected data provided through an input terminal 10-4 and to generate a comparison result at the output terminal 10-3.

The load board 120 includes a transmission line 20-1 that is connected to the output terminal of the data input driver 12-1. In addition, the load board 120 includes a transmission line 20-2 that is connected to the output terminal of the data input driver 12-2 and one of the input terminals of the comparator 14 as illustrated.

The memory module 180 includes a plurality of memory devices or elements 32-1, 32-2, . . . , and 32-n that include input pins 30-1, 30-3, . . . , and 30-(2n-1) and input/output pins 30-2, 30-4, . . . , and 30-2n. The input pins 30-1, 30-3, . . . , and 30-(2n-1) are connected to the transmission line 20-1 and the input/output pins 30-2, 30-4, . . . , and 30-2n are connected to the transmission line 20-2. For purposes of illustration, the memory devices 32-1, 32-2, . . . , and 32-n are each depicted with a single input pin and a single input/output pin. It is nevertheless understood to those skilled in the art that the memory devices 32-1, 32-2, . . . , and 32-n typically include both a plurality of input pins and input/output pins. Moreover, the input pins 30-1, 30-3, . . . , and 30-(2n-1) for all of the memory devices 32-1, 32-2, . . . , and 32-n are shown connected to a single channel (i.e., transmission line 20-1) and the input/output pins 30-2, 30-4, . . . , and 30-2n for all of the memory devices 32-1, 32-2, . . . , and 32-n are shown connected to a single channel (i.e., transmission line 20-2). Alternatively, it should be understood that the memory devices 32-1, 32-2, . . . , and 32-n could be divided into groups of n units such that all n units in a single group are connected via common channels while memory devices in separate groups remain independent. As illustrated in FIG. 3, because the input pins 30-1, 30-3, . . . , and 30-(2n-1) of the memory devices 32-1, 32-2, . . . , and 32-n are commonly connected to a single data input driver 12-1 and the input/output pins 30-2, 30-4, . . . , and 30-2n of the memory devices 32-1, 32-2, . . . , and 32-n are connected to a single data input driver 12-2, the memory devices 32-1, 32-2, . . . , and 32-n cannot be tested in parallel, but instead are tested serially.

Although the test configuration of FIG. 3 may be different than that of FIG. 2, it nevertheless may suffer from the same disadvantages. That is, the test configuration of FIG. 3 may be adversely affected by round trip signal delays and signal distortion due to impedance mismatches when testing memory devices that operate at a relatively high speed.

SUMMARY OF THE INVENTION

It is therefore an object of the present invention to provide improved test systems for testing integrated circuit memory modules and devices.

It is another object of the present invention to provide improved test systems that can be used for testing high-speed integrated circuit memory modules and devices.

It is yet another object of the present invention to provide improved test systems for testing integrated circuit memory modules and devices that can reduce signal distortion that may occur as signals are passed between a test system and a memory module or device under test.

These and other objects, advantages, and features of the present invention may be provided by integrated circuit test systems that include a first input driver having an output terminal that is connected to a first test system port and a first biasing device that is connected between the first test system port and a reference voltage. The first biasing device comprises a Thévenin equivalent circuit that is represented by an impedance element and a non-zero power source. The impedance element may be used to match the impedance of a device under test, which can reduce distortion in signals passed between the device under test and the test system. Furthermore, the power source may be used to provide direct current (DC) signals at the pins of the device under test, which can allow the swing height (e.g., amplitude or magnitude) of the test signals to be reduced. That is, the test signals are superimposed upon the DC voltages to allow "high" and "low" logic levels to be manifested via relatively minor swings in the test signals. By reducing the swing height of the test signals, transmission speed can be improved thereby reducing round trip signal delay.

In accordance with an aspect of the invention, a second input driver has an output terminal that is connected to a second test system port and a second biasing device is connected between the second test system port and a reference voltage. The second biasing device comprising a Thévenin equivalent circuit that is represented by an impedance element and a non-zero power source.

In accordance with another aspect of the invention, a third input driver has an output terminal that is connected to the first test system port and a fourth input driver has an output terminal that is connected to the second test system port.

In accordance with still another aspect of the present invention, first and second transmission lines are used to connect the first and third input drivers to the first test system port and third and fourth transmission lines are used to connect the second and fourth input drivers to the second test system port.

In accordance with yet another aspect of the present invention, one of the first and third input drivers generates a DC signal when the other input driver in the pair transmits a control signal, e.g., an instruction and/or address signal.

In accordance with still another aspect of the present invention, the second and fourth input drivers both generate a DC signal when data is read from the memory device through the second test system port.

In accordance with still another aspect of the present invention, one of the second and fourth input drivers generates a DC signal when the other input driver in the pair transmits write data.

The DC signals generated by the input drivers are used conjunction with the DC signals provided by the power sources to ensure that a desired DC offset voltage is maintained on the signal transmission paths.

Test systems in accordance with the present invention can also be used to test a memory module having a plurality of memory devices with each device having an input pin and an input/output pin. In accordance with an illustrative embodiment, a test system includes a first signal channel that connects the input pins of the plurality of memory devices to each other and a second signal channel that connects the input/output pins of the plurality of memory devices to each other. A first pair of input drivers is connected to the first signal channel and a second pair of input drivers is connected to the second signal channel. In addition, a first impedance element and first power source are connected in series between the first signal channel and ground and a second impedance element and second power source are connected in series between the second signal channel and ground.

In accordance with yet another illustrative embodiment of the present invention, a test system for a memory module includes a first signal channel that connects the input pins of a plurality of memory devices to each other and a second signal channel that connects the input/output pins of the plurality of memory devices to each other. First and second input drivers are connected to the first signal channel at first and second nodes respectively. Similarly, third and fourth input drivers are connected to the second signal channel at first and second nodes respectively. In addition, a first impedance element and first power source are connected in series between first node of the first signal channel and ground, a second impedance element and second power source are connected in series between the second node of the first signal channel and ground, a third impedance element and third power source are connected in series between the first node of the second signal channel and ground, and a fourth impedance element and fourth power source are connected in series between the second node of the second signal channel and ground.

The test systems according to the present invention, which include impedance elements and power sources for maintaining a DC signal on the test signal transmission paths, can thus be used to test high-speed memory devices where signal distortion and round trip signal delay may be problematic.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
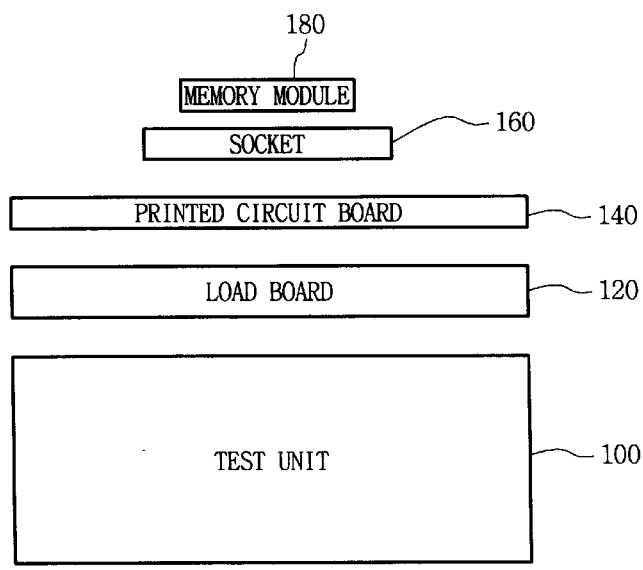
FIG. 1 is a high-level block diagram that depicts a conventional test system for verifying the operation of an integrated circuit memory module.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

Figure 4:
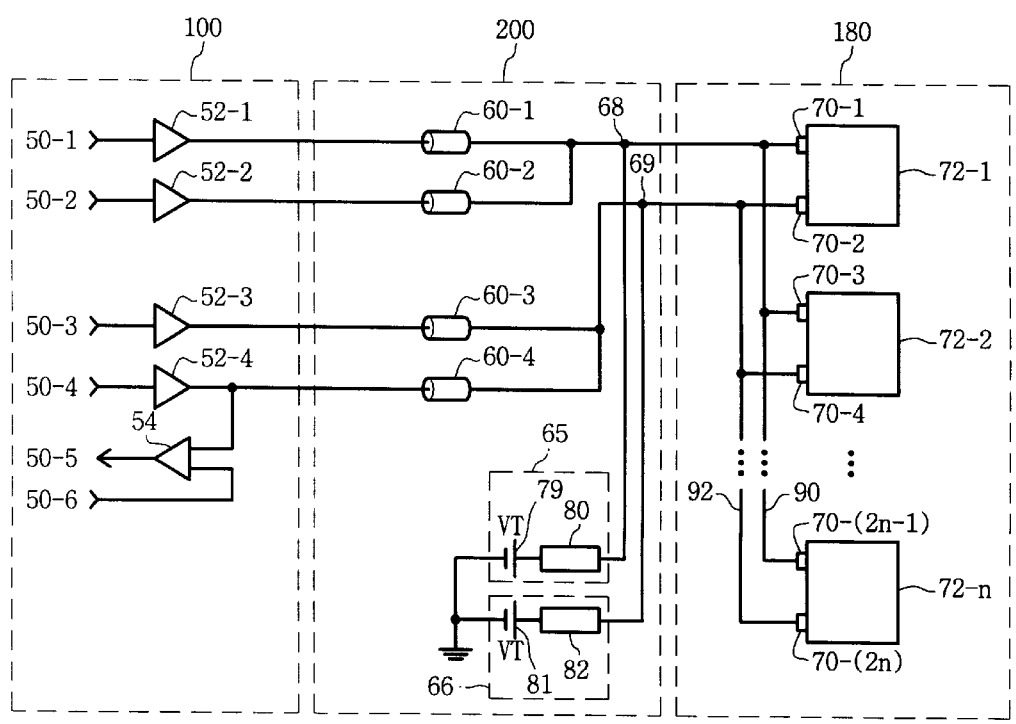
FIG. 4 is a schematic of a test system for an integrated circuit memory module in accordance with a first illustrative embodiment of the present invention.

For purposes of illustration and in no way limited thereto, integrated circuit test systems in accordance with the present invention will be described hereafter with respect to testing memory modules or devices. It should therefore be understood that the integrated test systems according to the present invention can be used to test other types of devices, systems, or circuits in addition to the memory modules discussed herein. With reference to FIG. 4, a test system according to a first embodiment of the present invention comprises a test unit 100, which includes both the hardware and software for controlling the testing operation, a load board 200, and a memory module 180. The test unit 100 includes a data input driver 52-1 that receives control signals (e.g., instruction data and address data) through an input terminal 50-1 and a data input driver 52-2 that is connected to a data input terminal 50-2. The test unit 100 further includes a data input driver 52-3 that receives write data through an input terminal 50-3 and a data input driver 52-4 that is connected to a data input terminal 50-4. Finally, the test unit 100 includes a comparator 54 that is used to compare read data from the memory module 180 with expected data provided through an input terminal 50-6 and to generate a comparison result at an output terminal 50-5.

The load board 200 includes a transmission line 60-1 that is connected between the output terminal of the data input driver 52-1 and a test system port 68, a transmission line 60-2 that is connected between the output terminal of the data input driver 52-2 and the test system port 68, a transmission line 60-3 that is connected between the output terminal of the data input driver 52-3 and a test system port 69, and a transmission line 60-4 that is connected between the output terminal of the data input driver 52-4 and one of the input terminals of the comparator 54 and the test system port 69 as illustrated. In addition, the load board 200 includes a first biasing device 65 that is connected between a first test system port 68 and a reference voltage and a second biasing device 66 that is connected between a second test system port 69 and the reference voltage. In a preferred embodiment, the reference voltage corresponds to ground. The biasing device 65 comprises a circuit having a Thévenin equivalent represented by an impedance element 80 and a power source 79 that generates a non-zero voltage VT. The biasing device 66 comprises a circuit having a Thévenin equivalent represented by an impedance element 82 and a power source 81 that also generates a voltage VT.

The memory module 180 includes a plurality of memory devices or elements 72-1, 72-2, . . . , and 72-n that include input pins 70-1, 70-3, . . . , and 70-(2n-1) and input/output pins 70-2, 70-4, . . . , and 70-2n. The input pins 70-1, 70-3, . . . , and 70(2n-1) are commonly connected via a signal channel 90 to the transmission lines 60-1 and 60-2 and the impedance element 80 as shown. Similarly, the input/output pins 70-2, 70-4, . . . , and 70-2n are commonly connected via a signal channel 92 to the transmission lines 60-3 and 60-4 and the impedance element 82 as shown. For purposes of illustration, the memory devices 72-1, 72-2, . . . , and 72-n are each depicted with a single input pin and a single input/output pin. It is nevertheless understood to those skilled in the art that the memory devices 72-1, 72-2, . . . , and 72-n typically include both a plurality of input pins and input/output pins. Moreover, the input pins 70-1, 70-3, . . . , and 70-(2n-1) for all of the memory devices 72-1, 72-2, . . . , and 72-n are shown connected to a single signal channel 90 and the input/output pins 70-2, 70-4, . . . , and 70-2n for all of the memory devices 72-1, 72-2, . . . , and 72-n are shown connected to a single signal channel 92. Alternatively, it should be understood that the memory devices 72-1, 72-2, . . . , and 72-n could be divided into groups of n units such that all n units in a single group are connected via common signal channels while memory devices in separate groups remain independent.

A method that may be used for testing the memory module 180 is described hereafter. A typical test cycle involves the following steps: 1) input the write instruction and the write address, 2) perform a data write operation, 3) input the read instruction and read address, and 4) perform a data read operation. This cycle may be repeatedly performed until the operability of all memory devices 72-1, 72-2, . . . , and 72-n in the memory module 180 is verified. This test cycle will be discussed hereafter with reference to the test system configuration of FIG. 4. Moreover, the test cycle will be described by way of example in which a test of memory device 72-1 is performed.

The test unit 100 receives the write instruction and write address through the input terminal 50-1. The write instruction and write address are then provided to the input pins 70-1, 70-3, . . . , and 70-(2n-1) of the memory devices 72-1, 72-2, . . . , and 72-n through the data input driver 52-1 and the transmission line 60-1. Next, the memory devices 72-1, 72-2, . . . , and 72-n prepare for the write operation. Note that the write instruction and write address signal that is transmitted through the transmission line 60-1 is also provided in parallel to the biasing device 65, i.e., the impedance element 80 and power source 79 through the test system port 68 and to the data input driver 52-2 through the transmission line 60-2. The power source 79 exhibits a predetermined potential difference VT and, during transmission of the write instruction and write address signal through the data input driver 52-1, the test unit 100 generates a continuous direct current (DC) signal through the data input driver 52-2 to maintain a predetermined potential difference at the signal channel 90 where the input pins 70-1, 70-3, . . . , and 70-(2n-1) are commonly connected.

The data to be written into the selected memory cell in memory device 72-1 is received through the input terminal 50-3 and is provided to the input/output pin 70-2 through the data input driver 52-3 and the transmission line 60-3. The memory device 72-1 then enables the data to be written into the selected memory cell. Note that the write data signal that is transmitted through the transmission line 60-3 is also provided in parallel to the biasing device 66, i.e., the impedance element 82 and power source 81 through the test system port 69 and to the data input driver 52-4 through the transmission line 60-4. The power source 81 exhibits a predetermined potential difference VT and, during transmission of the write data signal through the data input driver 52-3, the test unit 100 generates a continuous DC signal through the data input driver 52-4 to maintain a predetermined potential difference at the signal channel 92 where the input/output pins 70-2, 70-4, . . . , and 70-2n are commonly connected.

After completing the data write operation, the test unit 100 receives the read instruction and read address through the input terminal 50-1 and, simultaneously, the data that has been previously written into the memory cell corresponding to the read address is received at the input terminal 50-6. The read instruction and read address are provided to the input pins 70-1, 70-3, . . . , and 70-(2n-1) of the memory devices 72-1, 72-2, . . . , and 72-n through the data input driver 52-1 and the transmission line 60-1. Next, the memory devices 72-1, 72-2, . . . , and 72-n prepare for the read operation. Note that the read instruction and read address signal that is transmitted through the transmission line 60-1 is also provided in parallel to the biasing device 65, i.e., the impedance element 80 and power source 79 through the test system port 68 and to the data input driver 52-2 through the transmission line 60-2. The power source 79 generates a predetermined potential difference VT and, during transmission of the read instruction and read address signal through the data input driver 52-1, the test unit 100 generates a continuous DC signal through the data input driver 52-2 to maintain a predetermined potential difference at the signal channel 90 where the input pins 70-1, 70-3, . . . , and 70-(2n-1) are commonly connected.

In the present example, the read address corresponds to a memory cell in memory device 72-1, therefore, the data are read through the input/output pins 70-2 and transmission line 60-4. The comparator 54 compares the data that are read from the memory device 72-1 with the expected data provided at the input terminal 50-6. The result of the comparison is provided through the output terminal 50-5. Note that the read data signal that is transmitted through the transmission line 60-4 is also provided in parallel to the biasing device 66, i.e., the impedance element 82 and power source 81 through the test system port 69 and to the data input driver 52-3 through the transmission line 60-3. The power source 81 generates a predetermined potential difference VT and, during transmission of the read data signal through the transmission line 60-4, the test unit 100 generates a continuous DC signal through the data input drivers 52-3 and 52-4 to maintain a predetermined potential difference at the signal channel 92 where the input/output pins 70-2, 70-4, . . . , and 70-2n are commonly connected.

The test unit 100 uses the results of the comparison operation to determine whether the memory device 72-1 is operating properly. More specifically, if a comparison result indicates that the read data and the expected data are identical, then the test unit 100 concludes that the memory device 72-1 is operating properly. On the other hand, if a comparison result indicates that the read data and expected data are not identical, then the test unit 100 identifies the memory device 72-1 as being inoperable or damaged. The test cycle can then be repeated for each of the memory devices 72-1, 72-2, . . . , and 72-n to test the entire memory module 180.

During the testing operations described hereinabove, the signal channels 90 and 92 are preferably maintained at a substantially constant level VT corresponding to the voltage level of the power sources 79 and 81. Preferably, the voltage VT exhibited by the power sources 79 and 81 is approximately midway between a "high" logic level and a "low" level to allow the swing height (e.g., amplitude or magnitude) of the test signals to be reduced. That is, the test signals are superimposed upon the DC voltage VT, which allows "high" and "low" logic levels to be manifested via relatively minor swings in the test signals. Advantageously, by reducing the swing height of the test signals, transmission speed can be improved thereby reducing round trip signal delay. The test unit 100 can apply a DC signal through data input drivers 52-2, 52-3, and 52-4 as needed to compensate for any voltage drops that could reduce the DC offset applied at the signal channels 90 and 92.

The impedance elements 80 and 82 of the biasing devices 65 and 66 are preferably formed with variable resistors to allow the impedance between the test unit 100, the load board 200, and the memory module 180 to be matched through adjustments to the impedance elements 80 and 82. In addition, the impedance elements 80 and 82 may serve to terminate the signals transmitted thereto, which can reduce signal reflection between the test unit 100 and the memory module 180. Accordingly, signal distortion can be reduced, which may be particularly beneficial in testing high-speed memory devices as discussed hereinbefore.

Figure 5:
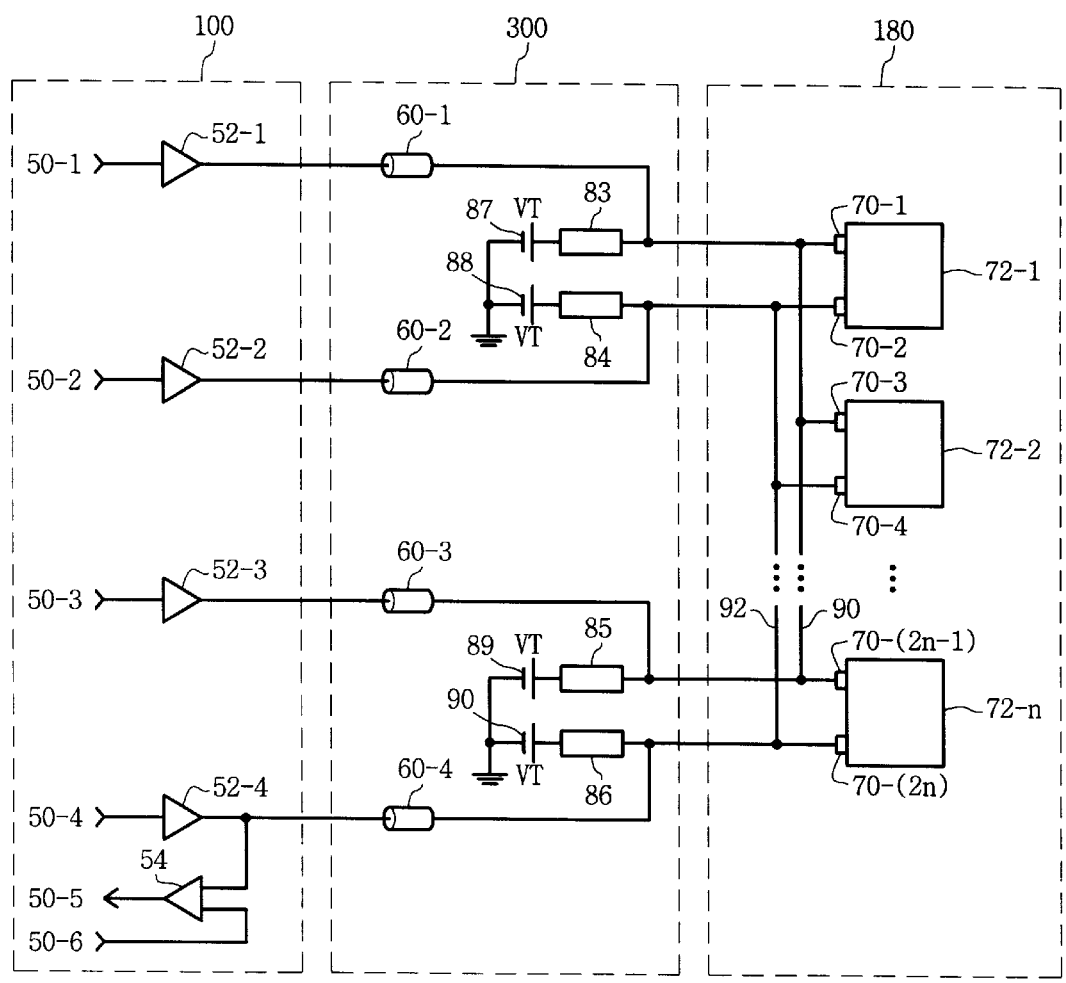
FIG. 5 is a schematic of a test system for an integrated circuit memory module in accordance with a second illustrative embodiment of the present invention.

With reference to FIG. 5, a test system according to a second embodiment of the present invention comprises a test unit 100, which includes both the hardware and software for controlling the testing operation, a load board 300, and a memory module 180. The test unit 100 includes a data input driver 52-1 that receives control signals (e.g., instruction data and address data) through an input terminal 50-1 and a data input driver 52-3 that is connected to a data input terminal 50-3. The test unit 100 further includes a data input driver 52-2 that receives write data through an input terminal 50-2 and a data input driver 52-4 that is connected to a data input terminal 50-4. Finally, the test unit 100 includes a comparator 54 that is used to compare read data from the memory module 180 with expected data provided through an input terminal 50-6 and to generate a comparison result at an output terminal 50-5.

The load board 300 includes a transmission line 60-1 that is connected to the output terminal of the data input driver 52-1, a transmission line 60-2 that is connected to the output terminal of the data input driver 52-2, a transmission line 60-3 that is connected to the output terminal of the data input driver 52-3, and a transmission line 60-4 that is connected to the output terminal of the data input driver 52-4 and one of the input terminals of the comparator 54 as illustrated. In addition, the load board 300 includes an impedance element 83 that is connected in series with a grounded power source 87 that generates a voltage VT, an impedance element 84 that is connected in series with a grounded power source 88 that generates a voltage VT, an impedance element 85 that is connected in series with a grounded power source 89 that generates a voltage VT, and an impedance element 86 that is connected in series with a grounded power source 90 that generates a voltage VT.

The memory module 180 includes a plurality of memory devices or elements 72-1, 72-2, . . . , and 72-n that include input pins 70-1, 70-3, . . . , and 70-(2n-1) and input/output pins 70-2, 70-4, . . . , and 70-2n. The input pins 70-1, 70-3, . . . , and 70(2n-1) are commonly connected via a signal channel 90 to the transmission lines 60-1 and 60-3 and the impedance elements 83 and 85 as shown. Similarly, the input/output pins 70-2, 70-4, . . . , and 70-2n are commonly connected via a signal channel 92 to the transmission lines 60-2 and 60-4 and the impedance elements 84 and 86 as shown. For purposes of illustration, the memory devices 72-1, 72-2, . . . , and 72-n are each depicted with a single input pin and a single input/output pin. It is nevertheless understood to those skilled in the art that the memory devices 72-1, 72-2, . . . , and 72-n typically include both a plurality of input pins and input/output pins. Moreover, the input pins 70-1, 70-3, . . . , and 70-(2n-1) for all of the memory devices 72-1, 72-2, . . . , and 72-n are shown connected to a single signal channel 90 and the input/output pins 70-2, 70-4, . . . , and 70-2n for all of the memory devices 72-1, 72-2, . . . , and 72-n are shown connected to a single signal channel 92. Alternatively, it should be understood that the memory devices 72-1, 72-2, . . . , and 72-n could be divided into groups of n units such that all n units in a single group are connected via common signal channels while memory devices in separate groups remain independent.

A method that may be used for testing the memory module 180 is described hereafter. A typical test cycle involves the following steps: 1) input the write instruction and the write address, 2) perform a data write operation, 3) input the read instruction and read address, and 4) perform a data read operation. This cycle may be repeatedly performed until the operability of all memory devices 72-1, 72-2, . . . , and 72-n in the memory module 180 is verified.

This test cycle will be discussed hereafter with reference to the test system configuration of FIG. 5. Moreover, the test cycle will be described by way of example in which a test of memory device 72-1 is performed. The test unit 100 receives the write instruction and write address through the input terminal 50-1. The write instruction and write address are then provided to the input pins 70-1, 70-3, ..., and 70-(2n-1) of the memory devices 72-1, 72-2, ..., and 72-n through the data input driver 52-1 and the transmission line 60-1. Next, the memory devices 72-1, 72-2, ..., and 72-n prepare for the write operation. Note that the write instruction and write address signal that is transmitted through the transmission line 60-1 is also provided in parallel to the impedance element 83 and power source 87, to the data input driver 52-3 through the signal channel 90 and transmission line 60-3, and to the impedance element 85 and power source 89 through the signal channel 90. The power sources 87 and 89 exhibit a predetermined potential difference VT and, during transmission of the write instruction and write address signal through the data input driver 52-1, the test unit 100 generates a continuous DC signal through the data input driver 52-3 to maintain a predetermined potential difference at the signal channel 90 where the input pins 70-1, 70-3, ..., and 70-(2n-1) are commonly connected.

The data to be written into the selected memory cell in memory device 72-1 is received through the input terminal 50-2 and is provided to the input/output pin 70-2 through the data input driver 52-2 and the transmission line 60-2. The memory device 72-1 then enables the data to be written into the selected memory cell. Note that the write data signal that is transmitted through the transmission line 60-2 is also provided in parallel to the impedance element 84 and power source 88, to the impedance element 86 and power source 90 through the signal channel 92, and to the data input driver 52-4 through the signal channel 92 and the transmission line 60-4. The power sources 88 and 90 exhibit a predetermined potential difference VT and, during transmission of the write data signal through the data input driver 52-2, the test unit 100 generates a continuous DC signal through the data input driver 52-4 to maintain a predetermined potential difference at the signal channel 92 where the input/output pins 70-2, 70-4, ..., and 70-2n are commonly connected.

After completing the data write operation, the test unit 100 receives the read instruction and read address through the input terminal 50-1 and, simultaneously, the data that has been previously written into the memory cell corresponding to the read address is received at the input terminal 50-6. The read instruction and read address are provided to the input pins 70-1, 70-3, ..., and 70-(2n-1) of the memory devices 72-1, 72-2, ..., and 72-n through the data input driver 52-1 and the transmission line 60-1. Next, the memory devices 72-1, 72-2, ..., and 72-n prepare for the read operation. Note that the read instruction and read address signal that is transmitted through the transmission line 60-1 is also provided in parallel to the impedance element 83 and power source 87, to the data input driver 52-3 through the signal channel 90 and transmission line 60-3, and to the impedance element 85 and power source 89 through the signal channel 90. The power sources 87 and 89 exhibit a predetermined potential difference VT and, during transmission of the read instruction and read address signal through the data input driver 52-1, the test unit 100 generates a continuous DC signal through the data input driver 52-3 to maintain a predetermined potential difference at the signal channel 90 where the input pins 70-1, 70-3, ..., and 70-(2n-1) are commonly connected.

In the present example, the read address corresponds to a memory cell in memory device 72-1, therefore, the data are read through the input/output pins 70-2 and transmission line 60-4. The comparator 54 compares the data that are read from the memory device 72-1 with the expected data provided at the input terminal 50-6. The result of the comparison is provided through the output terminal 50-5. Note that the read data signal that is transmitted through the transmission line 60-4 is also provided in parallel to the impedance element 84 and power source 88, to the data input driver 52-2 through the transmission line 60-2, and to the impedance element 86 and power source 90 through the signal channel 92. The power sources 88 and 90 exhibit a predetermined potential difference VT and, during transmission of the read data signal through the transmission line 60-4, the test unit 100 generates a continuous DC signal through the data input drivers 52-2 and 52-4 to maintain a predetermined potential difference at the signal channel 92 where the input/output pins 70-2, 70-4, ..., and 70-2n are commonly connected.

The test unit 100 uses the results of the comparison operation to determine whether the memory device 72-1 is operating properly. More specifically, if a comparison result indicates that the read data and the expected data are identical, then the test unit 100 concludes that the memory device 72-1 is operating properly. On the other hand, if a comparison result indicates that the read data and expected data are not identical, then the test unit 100 identifies the memory device 72-1 as being inoperable or damaged. The test cycle can then be repeated for each of the memory devices 72-1, 72-2, ..., and 72-n to test the entire memory module 180.

During the testing operations described hereinabove, the signal channels 90 and 92 are preferably maintained at a substantially constant level of VT corresponding to the voltage level of the power sources 87, 88, 89, and 90. Preferably, the voltage VT exhibited by the power sources 87, 88, 89, and 90 is approximately midway between a "high" logic level and a "low" level to allow the swing height (e.g., amplitude or magnitude) of the test signals to be reduced. That is, the test signals are superimposed upon the DC voltage VT, which allows "high" and "low" logic levels to be manifested via relatively minor swings in the test signals. Advantageously, by reducing the swing height of the test signals, transmission speed can be improved thereby reducing round trip signal delay. The test unit 100 can apply a DC signal through data input drivers 52-2, 52-3, and 52-4 as needed to compensate for any voltage drops that could reduce the DC offset applied at the signal channels 90 and 92.

The impedance elements 83, 84, 85, and 86 of the load board 300 are preferably formed with variable resistors to allow the impedance between the test unit 100, the load board 300, and the memory module 180 to be matched through adjustments to the impedance elements 83, 84, 85, and 86. In addition, the impedance elements 83, 84, 85, and 86 may serve to terminate the signals transmitted thereto, which can reduce signal reflection between the test unit 100 and the memory module 180. Accordingly, signal distortion can be reduced, which may be particularly beneficial in testing high-speed memory devices as discussed hereinbefore.

Figure 6:
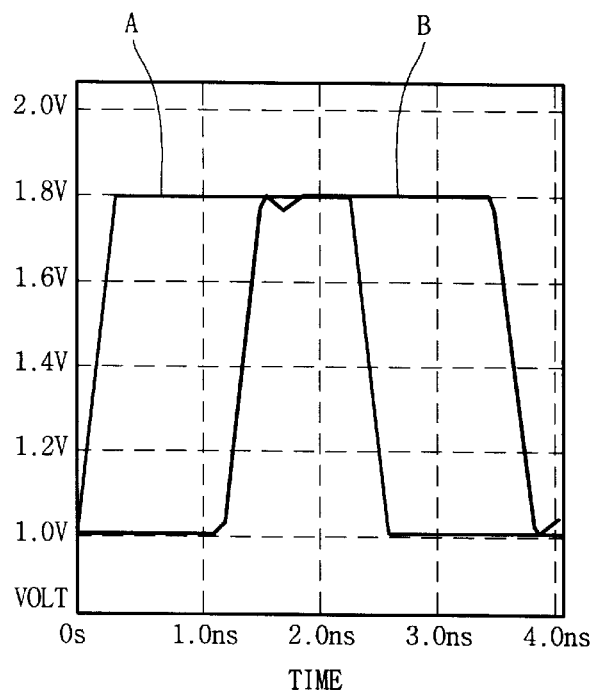
FIGS. 6 and 7 are graphs of a test signal transmitted from the memory module to the test unit for the FIG. 4 and FIG. 5 embodiments respectively.
Figure 7:
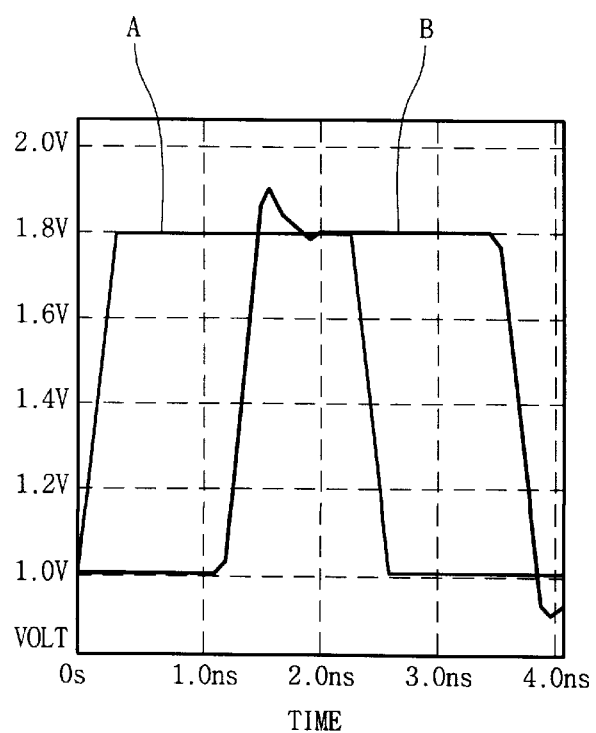

FIGS. 6 and 7 are examples of how signal distortion between the test unit 100 and the memory module 180 can be reduced in accordance with the present invention. With reference to FIGS. 6 and 7, signal A is an output signal from an input/output pin (e.g., 70-2) of a memory device (e.g., 72-1) corresponding to the embodiments of FIGS. 4 and 5. Signal B is an output signal from the comparator 54. As can be seen from the graphs, signal A is relatively undistorted as it travels from the memory module 180, through the load board 200 or 300, and reaches the test unit 100. Thus, signal distortion can be reduced between the test unit 100 and the memory module 180 by selectively tuning or choosing the impedance elements.

Figure 2:
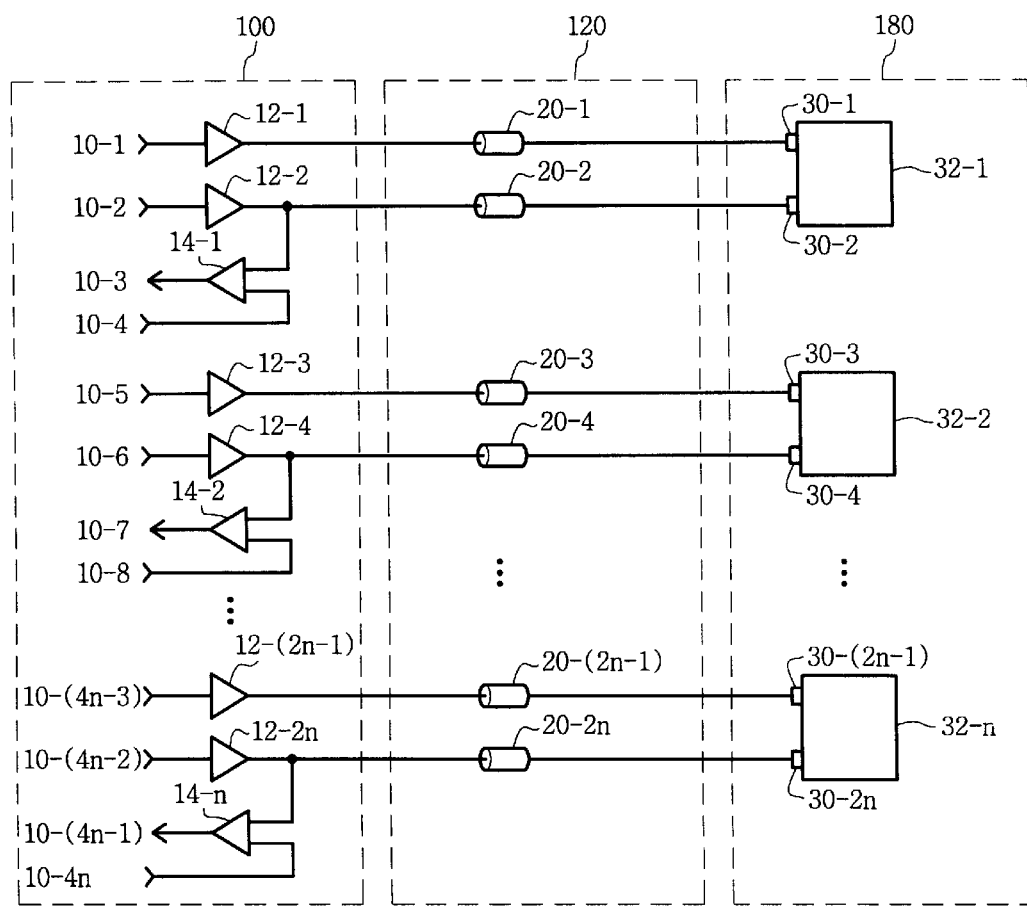
FIG. 2 is a schematic of the test system of FIG. 1 that illustrates a first embodiment of the test unit, load board, and memory module that uses independent channel signaling.
Figure 3:
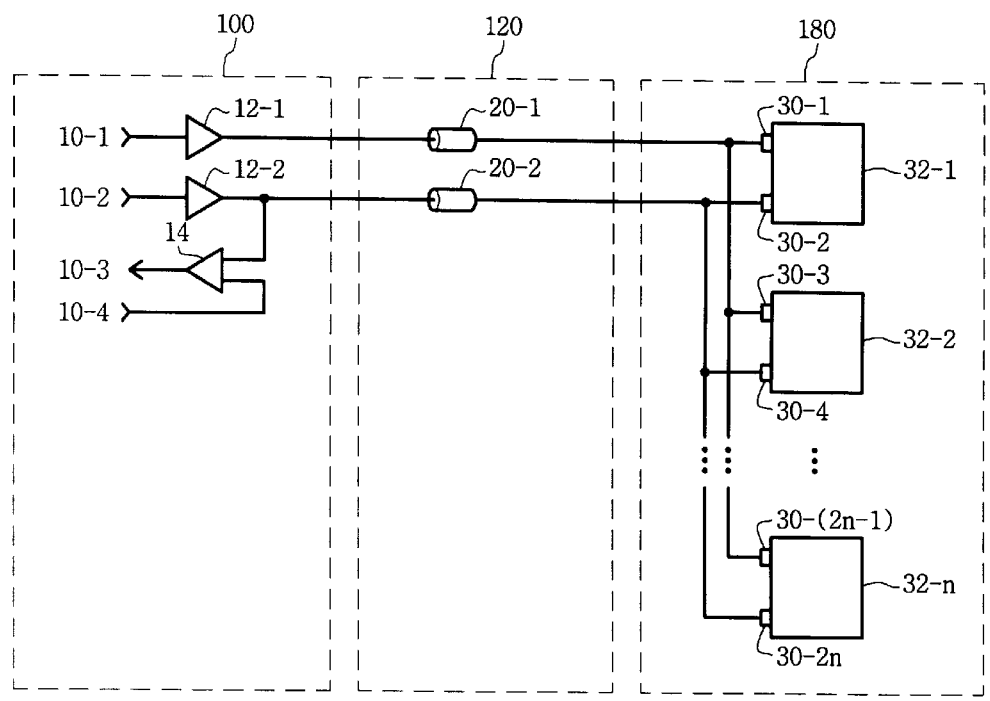
FIG. 3 is a schematic of the test system of FIG. 1 that illustrates a second embodiment of the test unit, load board, and memory module that uses common channel signaling.

It will be appreciated that the principles of the present invention can be applied to memory modules using the independent channel signaling system of FIG. 2 or the common channel signaling system of FIG. 3. For example, with respect to the independent channel signaling system of FIG. 2, two data input drivers can be commonly connected to an input pin of a memory device through a pair of transmission lines and two data input drivers can be commonly connected to an input/output pin of the memory device through a pair of transmission lines. The input pin and input/output pin can each be connected to an impedance element, which is in series with a grounded power source. Memory modules using the independent channel signaling system can therefore be tested as discussed hereinabove with respect to the embodiments of FIGS. 4 and 5.

The principles of the present invention have been illustrated herein as they are applied to memory module testing. From the foregoing it can readily be seen that the present invention provides for impedance matching between a test unit, load board, and memory module through the use of impedance elements. Moreover, data input drivers are pairwise connected to the input pins and input/output pins of the memory devices and a predetermined voltage is continuously applied to the signal channels to allow signal swing height to be reduced, which can reduce round trip signal delay.

In concluding the detailed description, it should be noted that many variations and modifications can be made to the preferred embodiment without substantially departing from the principles of the present invention. All such variations and modifications are intended to be included herein within the scope of the present invention, as set forth in the following claims.

We claim:

1. An integrated circuit test system, comprising:
   a first input driver having an output terminal that is connected to a first test system port; and
   a first biasing device connected between the first test system port and a reference voltage, the first biasing device comprising a first Thévenin equivalent circuit represented by a first impedance element and a first non-zero voltage source.

2. An integrated circuit test system as recited in claim 1, further comprising:
   a second input driver having an output terminal that is connected to a second test system port; and
   a second biasing device connected between the first test system port and the reference voltage, the second biasing device comprising a second Thévenin equivalent circuit represented by a second impedance element and a second non-zero voltage source.

3. An integrated circuit test system as recited in claim 2, further comprising a comparator having one input terminal connected to the output terminal of the second input driver and a second input terminal for receiving comparison data.

4. An integrated circuit test system as recited in claim 2, further comprising:
   a third input driver having an output terminal that is connected to the first test system port; and
   a fourth input driver having an output terminal that is connected to the second test system port.

5. An integrated circuit test system as recited in claim 4, further comprising:
   first and second transmission lines that respectively connect the output terminals of the first and third input drivers to the first test system port; and
   third and fourth transmission lines that respectively connect the output terminals of the second and fourth input drivers to the second test system port.

6. An integrated circuit test system as recited in claim 4, wherein one of the first and third input drivers generates a direct current signal at the output terminal thereof when the other one of the first and third input drivers transmits a control signal.

7. An integrated circuit test system as recited in claim 4, wherein the second and fourth input drivers generate a direct current signal at the output terminals thereof when data is read through the second test system port.

8. An integrated circuit test system as recited in claim 4, wherein one of the second and fourth input drivers generates a direct current signal at the output terminal thereof when the other one of the second and fourth input drivers transmits write data.

9. An integrated circuit test system as recited in claim 2, wherein the first and second impedance elements are variable resistors.

10. An integrated circuit test system as recited in claim 2, wherein the first and second power sources generate a predetermined voltage level.

11. An integrated circuit test system as recited in claim 10, wherein the predetermined voltage level is approximately midway between a logic high level and a logic low level.

12. A test system for an integrated circuit memory module having a plurality of memory devices each having an input pin and an input/output pin, comprising:
   a first signal channel that connects the input pins of the plurality of memory devices to each other;
   a second signal channel that connects the input/output pins of the plurality of memory devices to each other;
   first and second input drivers each having an output terminal that is connected to the first signal channel;
   third and fourth input drivers each having an output terminal that is connected to the second signal channel;
   a first impedance element and a first power source that are connected in series between the first signal channel and ground; and
   a second impedance element and a second power source that are connected in series between the second signal channel and ground.

13. A test system as recited in claim 12, further comprising a comparator having one input terminal connected to the output terminal of the fourth input driver and a second input terminal for receiving comparison data.

14. A test system as recited in claim 12, further comprising:
   first and second transmission lines that respectively connect the output terminals of the first and second input drivers to the first signal channel; and
   third and fourth transmission lines that respectively connect the output terminals of the third and fourth input drivers to the second signal channel.

15. A test system as recited in claim 12, wherein one of the first and
   second input drivers generates a direct current signal at the output terminal thereof when the other one of the first and second input drivers transmits a control signal.

16. A test system as recited in claim 12, wherein the third and fourth input drivers generate a direct current signal at the output terminals thereof when data is read from the memory device through the input/output pin.

17. A test system as recited in claim 12, wherein one of the third and fourth input drivers generates a direct current signal at the output terminal thereof when the other one of the third and fourth input drivers transmits write data.

18. A test system as recited in claim 12, wherein the first and second impedance elements are variable resistors.

19. A test system as recited in claim 12, wherein the first and second power sources generate a predetermined voltage level.

20. A test system as recited in claim 19, wherein the predetermined voltage level is approximately midway between a logic high level and a logic low level.

21. A test system for an integrated circuit memory module having a plurality of memory devices each having an input pin and an input/output pin, comprising:

a first signal channel that connects the input pins of the plurality of memory devices to each other;

a second signal channel that connects the input/output pins of the plurality of memory devices to each other;

a first input driver having an output terminal that is connected to the first signal channel at a first node;

a second input driver having an output terminal that is connected to the first signal channel at a second node;

a third input driver having an output terminal that is connected to the second signal channel at a first node;

a fourth input driver having an output terminal that is connected to the second signal channel at a second node;

a first impedance element and a first power source that are connected in series between the first node of the first signal channel and ground;

a second impedance element and a second power source that are connected in series between the second node of the first signal channel and ground;

a third impedance element and a third power source that are connected in series between the first node of the second signal channel and ground; and a fourth impedance element and a fourth power source that are connected in series between the second node of the second signal channel and ground.

22. A test system as recited in claim 21, further comprising a comparator having one input terminal connected to the output terminal of the fourth input driver and a second input terminal for receiving comparison data.

23. A test system as recited in claim 21, further comprising:

first and second transmission lines that respectively connect the output terminals of the first and second input drivers to the first and second nodes of the first signal channel; and third and fourth transmission lines that respectively connect the output terminals of the third and fourth input drivers to the first and second nodes of the second signal channel.

24. A test system as recited in claim 21, wherein one of the first and second input drivers generates a direct current signal at the output terminal thereof when the other one of the first and second input drivers transmits a control signal.

25. A test system as recited in claim 21, wherein the third and fourth input drivers generate a direct current signal at the output terminals thereof when data is read from the memory device through the input/output pin.

26. A test system as recited in claim 21, wherein one of the third and fourth input drivers generates a direct current signal at the output terminal thereof when the other one of the third and fourth input drivers transmits write data.

27. A test system as recited in claim 21, wherein the first, second, third, and fourth impedance elements are variable resistors.

28. A test system as recited in claim 21, wherein the first, second, third, and fourth power sources generate a predetermined voltage level.

29. A test system as recited in claim 28, wherein the predetermined voltage level is approximately midway between a logic high level and a logic low level.

* * * * *